US011619691B2

(12) United States Patent
Wu et al.

(10) Patent No.: US 11,619,691 B2
(45) Date of Patent: Apr. 4, 2023

(54) INTEGRATED COOLING CIRCUIT FOR USE WITH A SUPERCONDUCTING MAGNET

(71) Applicant: General Electric Company, Schenectady, NY (US)

(72) Inventors: Anbo Wu, Clifton Park, NY (US); Minfeng Xu, Ballston Lake, NY (US); Paul St. Mark Shadforth Thompson, Stephentown, NY (US)

(73) Assignee: General Electric Company, Schenectady, NY (US)

( * ) Notice: Subject to any disclaimer, the term of this patent is extended or adjusted under 35 U.S.C. 154(b) by 1007 days.

(21) Appl. No.: 16/402,038

(22) Filed: May 2, 2019

(65) Prior Publication Data
US 2020/0348379 A1 Nov. 5, 2020

(51) Int. Cl.
F17C 13/02 (2006.01)
G01R 33/34 (2006.01)
H01F 6/04 (2006.01)
F25D 19/00 (2006.01)
F17C 13/00 (2006.01)

(52) U.S. Cl.
CPC ........ G01R 33/3403 (2013.01); F17C 13/007 (2013.01); F25D 19/00 (2013.01); G01R 33/34023 (2013.01); H01F 6/04 (2013.01)

(58) Field of Classification Search
CPC ...... F25B 9/00; F25B 9/10; F25B 9/12; F25B 9/14; F25B 9/145; G01R 33/3403; G01R 33/34023; F17C 13/04; F17C 13/086; F17C 13/087; H01F 6/04; F25D 19/00
See application file for complete search history.

(56) References Cited

U.S. PATENT DOCUMENTS

| 8,374,663 B2 | 2/2013 | Laskaris et al. |
| 8,544,281 B2 | 10/2013 | Zhang et al. |
| 8,643,367 B2 | 2/2014 | Huang et al. |
| 8,676,282 B2 | 3/2014 | Jiang et al. |
| 9,274,188 B2 | 3/2016 | Shen et al. |
| 2004/0212364 A1* | 10/2004 | Morita ............. G01R 33/34007 324/318 |
| 2007/0101742 A1 | 5/2007 | Laskaris et al. |
| 2007/0245749 A1 | 10/2007 | Atkins et al. |
| 2009/0146676 A1* | 6/2009 | Zogmal ................. F25D 19/006 324/750.08 |
| 2011/0179809 A1* | 7/2011 | Zhang ....................... H01F 6/04 62/51.1 |
| 2013/0096007 A1* | 4/2013 | Harrison ............ G01R 33/3804 324/322 |
| 2014/0202174 A1* | 7/2014 | Wang ...................... F25B 9/145 62/6 |

(Continued)

OTHER PUBLICATIONS

Stautner, W., et al.; "A New Cooling Technology for the Cooling of HTS Magnets", IEEE Transactions on Applied Superconductivity, vol. 17, Issue 2, pp. 220-2203, Jun. 2007.

Primary Examiner — Brian M King

(57) ABSTRACT

The present disclosure relates to using an integrated cooling circuit to provide both forced-flow pre-cooling functionality and closed-loop thermosiphon cooling for persistent mode operation of a superconducting magnet. In one embodiment, the integrated cooling circuit shares a single set of cooling tubes for use with both the forced-flow pre-cooling circuit as well as the closed-loop operating-state cooling circuit.

15 Claims, 5 Drawing Sheets

(56) References Cited

U.S. PATENT DOCUMENTS

2016/0187435 A1* 6/2016 Jiang ................. G01R 33/3804
62/51.1
2016/0189841 A1 6/2016 Li et al.

* cited by examiner

INTEGRATED COOLING CIRCUIT FOR USE WITH A SUPERCONDUCTING MAGNET

STATEMENT REGARDING FEDERALLY SPONSORED RESEARCH & DEVELOPMENT

This invention was made with Government support under contract number 1U01EB026976-01 awarded by the National Institutes of Health (NIH). The Government has certain rights in the invention.

TECHNICAL FIELD

The subject matter disclosed herein relates to an integrated cooling circuit for use in superconducting magnet applications.

BACKGROUND

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

In the case of magnetic resonance imaging (MRI), acquisition of images is based on the interactions among a primary magnetic field, a radiofrequency (RF) magnetic field, and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

To achieve the necessary magnetic fields for generating images using such a process, an MRI system may employ one or more superconducting magnets. Such magnets typically operate at extremely low temperature. In practice, it may be difficult to achieve and maintain the necessary working temperature for such superconducting magnets in an efficient manner.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a cryogenic cooling system is provided. In accordance with this embodiment, the cryogenic cooling system comprises: a superconducting magnet comprising a set of magnet coils disposed on a cylindrical coil support structure and a cooling system configured to cool at least the set of magnet coils. The cooling system has an operational mode and a pre-cooling mode. In accordance with this embodiment, the cooling system comprises: a recondensor configured to recondense cryogen from vapor to liquid; a first line configured to allow cryogen to be added to the cooling system and connecting to the recondensor, wherein a first end of the first line is outside of a vacuum vessel; a storage vessel in fluid communication with the recondensor and configured to hold cryogen; a plurality of cooling tubes in fluid communication with the storage vessel and configured to cool the set of magnet coils during operation; a return line configured to convey cryogen from the plurality of cooling tubes to the recondensor; a second line in fluid communication with the return line, wherein a first end of the second line is outside of the vacuum vessel; a mode selector valve provided on the return line; a first valve provided on the first line; and a second valve provided on the second line. In the pre-cooling mode the mode selector valve is closed, the first valve is open, and the second valve is open so that cryogen flows in through one of the first line or the second line, through the cooling tubes, the storage vessel, and the recondensor, and out through the other of the first line or the second line.

In a further embodiment, a cryogenic cooling system is provided. In accordance with this embodiment, the cryogenic cooling system comprises: a superconducting magnet comprising a set of magnet coils disposed on a cylindrical coil support structure; a bucking (shielding) coil superconducting magnet comprising a set of bucking coils on a cylindrical bucking coil support structure, wherein the bucking coil support structure is radially offset from and external to the cylindrical coil support structure; and a cooling system configured to cool at least the set of magnet coils. The cooling system has an operational mode and a pre-cooling mode. The cooling system comprises: a recondensor configured to recondense cryogen from vapor to liquid; a first line configured to allow cryogen to be added to the cooling system and connecting to the recondensor, wherein a first end of the first line is outside of a vacuum vessel; a storage vessel in fluid communication with the recondensor and configured to hold cryogen; a plurality of bucking coil cooling tubes in fluid communication with the storage vessel and configured to cool the set of bucking coils during operation; a bucking return line configured to convey cryogen from the plurality of bucking coil tubes to one of the recondensor or the storage vessel; a second line in fluid communication with the bucking coil cooling tubes, wherein a first end of the second line is outside of the vacuum vessel; a bypass line fluidly connecting the second line and the first line; a mode selector valve provided on the bypass line; a first valve provided on the first line; and a second valve provided on the second line. In the pre-cooling mode the mode selector valve is closed, the first valve is open, and the second valve is open so that cryogen flows in through one of the first line or the second line, through the bucking coil cooling tubes, the bucking return line, and one of the storage vessel or recondensor, and out through the other of the first line or the second line.

In an additional embodiment, a method for cooling a superconducting magnet is provided. In accordance with this method in a pre-cooling phase, a mode selector valve that directly or indirectly controls flow of cryogen from a first line to a second line is closed. A second valve and a first valve that control flow of cryogen through the second line and the first line respectively are opened. Cryogen is flowed from the one of the first line or the second line to the other of first line or the second line through one or both of a plurality of cooling tubes for cooling a set of magnet coils or a plurality of bucking coil cooling tubes for cooling a set of bucking coils. In an operational cooling phase, the mode selector valve is opened and the second valve and the first valve are closed. Cryogen is flowed from a storage vessel through the plurality of cooling tubes and a return line to a recondensor. Cryogen is flowed from the storage vessel through the plurality of bucking coil cooling tubes and a bucking return line to the recondensor.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
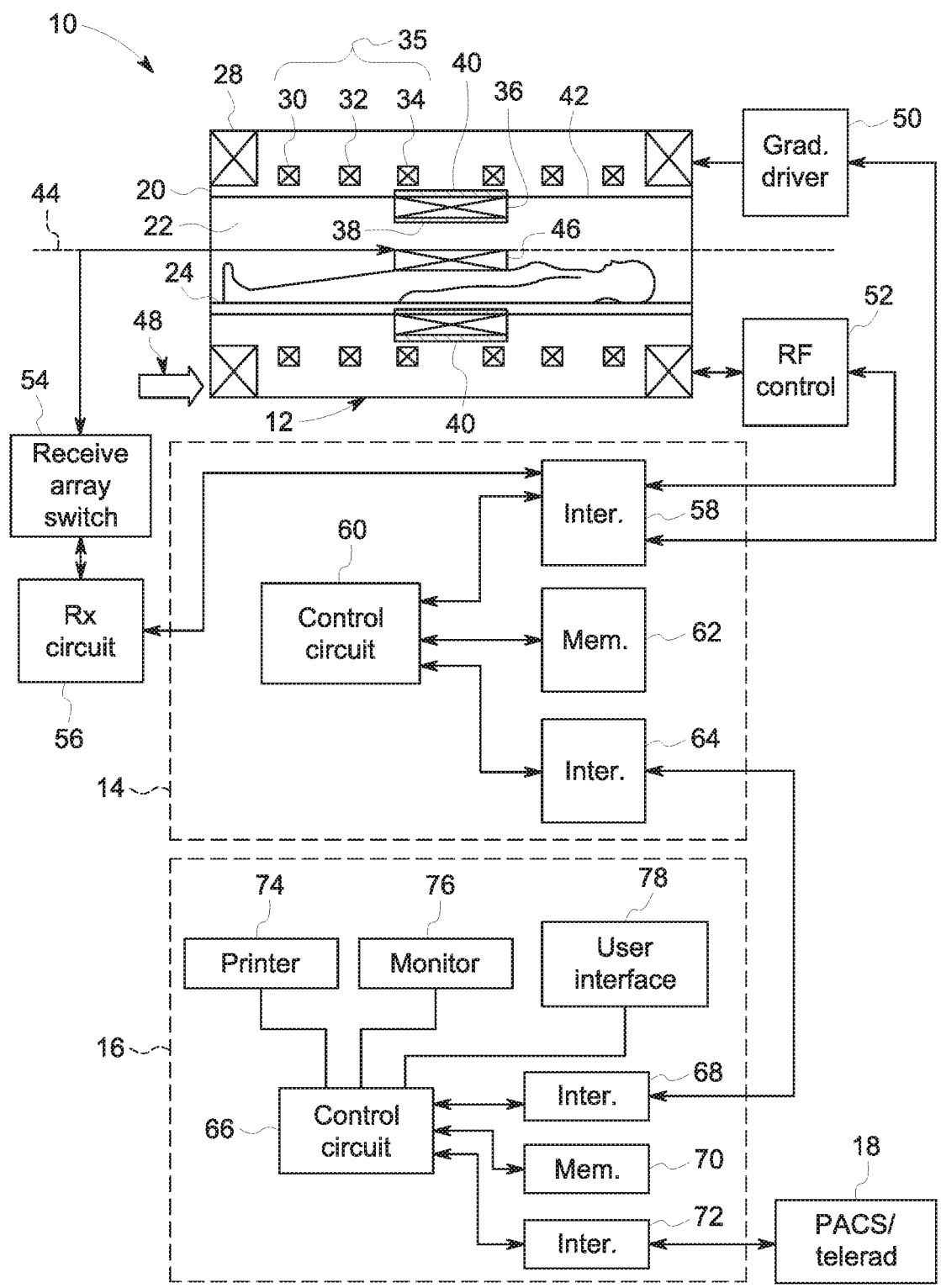
FIG. 1 illustrates a magnetic resonance imaging (MRI) system having gradient coils, radio frequency (RF) coils, and RF shielding, in accordance with an aspect of the present disclosure.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

In magnetic resonance imaging (MRI), interactions between a primary magnetic field, time varying magnetic gradient fields, and a radiofrequency (RF) field with gyromagnetic material(s) within a subject of interest (e.g., a patient) are used to generate images or volumetric representations of structural and/or functional relationships within the patient. Gyromagnetic materials, such as hydrogen nuclei in water molecules, have characteristic behaviors in response to externally applied electromagnetic fields (e.g., constant or time varying electric fields, magnetic fields, or a combination thereof) that may be leveraged in this manner. For example, the precession of spins of these nuclei can be influenced by manipulation of the fields to produce RF signals that can be detected, processed, and used to reconstruct a useful image.

To achieve the necessary magnetic fields for generating images using such a process, an MRI system may employ one or more superconducting magnets. Such magnets typically operate at extremely low temperature. In practice, it may be difficult to achieve and maintain the necessary working temperature for such superconducting magnets in an efficient manner. In particular, the initial cooling requirements to lower the temperature of the magnet(s) and the operational cooling requirements to maintain the magnet within the desired operational temperature range (e.g., a suitable superconducting temperature, such as approximately 4.2 Kelvin (K)) may present different issues in terms of performance. With this in mind, a low cryogen magnet may conventionally be provided with two separate sets of cooling circuits: a closed-loop thermosiphon cooling loop for use during operation and a separate precooling circuit to initially lower the temperature of the magnet to within a range at which the thermosiphon cooling loop takes over. However, such arrangement a dual cooling circuit arrangement require additional plumbing, machining features, and welding joints on the associated magnetic coil support structure. Further, two sets of cooling circuits increase the magnet cost and complexity.

With this in mind, the present disclosure relates to using an integrated cooling circuit to provide both forced-flow pre-cooling functionality and closed-loop thermosiphon cooling for persistent mode operation of a superconducting magnet. In one embodiment, the integrated cooling circuit shares a single set of cooling tubes (which may be the majority of the flow path) for use with both a forced-flow pre-cooling circuit as well as a closed-loop operating-state cooling circuit. A valve may be included in the return path of the closed-loop circuit in one embodiment, and the state of this valve (i.e., open or closed) determines whether the flow path corresponds to the forced cooling mode or the closed loop cooling mode. One or more external valves may also be provided at the inlet and outlet of the forced flow cooling tubes respectively. In accordance with this technique, the cooling circuit is simplified and magnet cost may be reduced.

With this in mind, the embodiments described herein may be implemented as a part of an MRI system using superconducting magnets. Such a system may perform data acquisition, data construction, and image synthesis. By way of background, and to provide useful real-world context, aspects of such an MRI system and their function will be described. Accordingly, referring to FIG. 1, a magnetic resonance imaging system 10 is illustrated schematically as including a scanner 12, scanner control circuitry 14, and system control circuitry 16.

The imaging system 10 additionally includes remote access and storage systems 18 and/or devices such as picture archiving and communication systems (PACS), or other devices such as teleradiology equipment so that data acquired by the imaging system 10 may be accessed on- or off-site. While the imaging system 10 may include any suitable scanner or detector, in the illustrated embodiment, the imaging system 10 includes a full body scanner 12 having a housing 20 through which an opening (e.g., an annular opening) is formed to accommodate a patient bore 22. The patient bore 22 may be made of any suitable material such as a non-metallic and/or non-magnetic material and generally includes components of the scanner 12 proximate to a subject. A table 24 is moveable into the patient bore 22 to permit a patient 26 to be positioned therein for imaging selected anatomy within the patient 26. As described herein, the patient bore 22 may include one or more bore tubes to support various components of the scanner 12 and/or the patient 26. In some embodiments, the patient bore 22 may support the table 24 and/or articulation components (e.g., a motor, pulley, and/or slides).

The scanner 12 may include a series of associated superconducting magnetic coils for producing controlled electromagnetic fields for exciting the gyromagnetic material within the anatomy of the subject being imaged. As discussed herein, such superconducting magnets typically operate at extremely low temperatures (e.g., a superconducting temperature, such as 4.2 Kelvin (K)). Specifically, a primary magnet coil 28 is provided for generating a primary magnetic field, which is generally aligned with an axis 44 of the patient bore 22. A series of gradient coils 30, 32, and 34 (collectively 35) permit controlled magnetic gradient fields to be generated for positional encoding of certain of the gyromagnetic nuclei within the patient 26 during examination sequences. An RF coil 36 is configured to generate radio frequency pulses for exciting the certain gyromagnetic nuclei within the patient 26. In accordance with an aspect of the present disclosure, the RF coil 36 may be implemented on a coil support tube 38 defining at least a portion of the patient bore 22. Further, an RF shield 40 may be implemented on a shield support tube 42 also defining at least a portion of the patient bore 22 to reduce electromagnetic interference within the imaging system 10, as well as devices separate from the imaging system 10. In addition to the coils that may be local to the scanner 12, the imaging system 10 may also include a set of receiving coils 46 (e.g., an array of coils) configured for placement proximal (e.g., against) to the patient 26. As an example, the receiving coils 46 can include cervical/thoracic/lumbar (CTL) coils, head coils, single-sided spine coils, and so forth. Generally, the receiving coils 46 are placed close to or on top of the patient 26 so as to receive the weak RF signals (e.g., weak relative to the transmitted pulses generated by the scanner coils) that are generated by certain of the gyromagnetic nuclei within the patient 26 as they return to their relaxed state. In some embodiments, the RF coils 36 may both transmit and receive RF signals accomplishing the role of the receiving coils 46.

The various coils of the imaging system 10 are controlled by external circuitry to generate the desired field and pulses, and to read emissions from the gyromagnetic material in a controlled manner. In the illustrated embodiment, a main power supply 48 provides power to the primary magnetic coil 28 to generate the primary magnetic field. A driver circuit 50 may include amplification and control circuitry for supplying current to the coils as defined by digitized pulse sequences output by the scanner control circuitry 14.

An RF control circuit 52 is provided for regulating operation of the RF coil 36. The RF control circuit 52 includes a switching device for alternating between the active and inactive modes of operation, wherein the RF coil 36 transmits and does not transmit signals, respectively. The RF control circuit 52 may also include amplification circuitry to generate the RF pulses. Similarly, the receiving coils 46, or RF coils 36 if no separate receiving coils 46 are implemented, are connected to a switch 54, which is capable of switching the receiving coils 46 between receiving and non-receiving modes. Thus, the receiving coils 46 may resonate with the RF signals produced by relaxing gyromagnetic nuclei from within the patient 26 while in the receiving mode, and avoid resonating with RF signals while in the non-receiving mode. Additionally, a receiving circuit 56 may receive the data detected by the receiving coils 46 and may include one or more multiplexing and/or amplification circuits.

It should be noted that while the scanner 12 and the control/amplification circuitry described above are illustrated as being connected by single lines, one or more cables or connectors may be used depending on implementation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner 12 and the scanner control circuitry 14 and/or system control circuitry 16.

As illustrated, the scanner control circuitry 14 includes an interface circuit 58, which outputs signals for driving the gradient coils 35 and the RF coil 36 and for receiving the data representative of the magnetic resonance signals produced in examination sequences. The interface circuit 58 may be connected to a control and analysis circuit 60. The control and analysis circuit 60 executes the commands to the driver circuit 50 and RF control circuit 52 based on defined protocols selected via system control circuitry 16.

The control and analysis circuit 60 may also serve to receive the magnetic resonance signals and perform subsequent processing before transmitting the data to system control circuitry 16. Scanner control circuitry 14 may also include one or more memory circuits 62, which store configuration parameters, pulse sequence descriptions, examination results, and so forth, during operation.

A second interface circuit 64 may connect the control and analysis circuit 60 to a system control circuit 66 for exchanging data between scanner control circuitry 14 and system control circuitry 16. The system control circuitry 16 may include a third interface circuit 68, which receives data from the scanner control circuitry 14 and transmits data and commands back to the scanner control circuitry 14. As with the control and analysis circuit 60, the system control circuit 66 may include a computer processing unit (CPU) in a multi-purpose or application specific computer or workstation. System control circuit 66 may include or be connected to a second memory circuit 70 to store programming code for operation of the imaging system 10 and to store the processed image data for later reconstruction, display and transmission. The programming code may execute one or more algorithms that, when executed by a processor, are configured to perform reconstruction of acquired data.

An additional input output (I/O) interface 72 may be provided for exchanging image data, configuration parameters, and so forth with external system components such as remote access and storage systems 18. Finally, the system control circuit 66 may be communicatively coupled to various peripheral devices for facilitating an operator interface and for producing hard copies of the reconstructed images. In the illustrated embodiment, these peripherals include a printer 74, a monitor 76, and a user interface 78 including, for example, devices such as a keyboard, a mouse, a touchscreen (e.g., integrated with the monitor 76), and so forth.

In operation, a user (e.g., a radiologist) may configure and/or oversee control of the imaging system 10. Additionally, the user may assist in positioning the subject (e.g., a patient 26) within the patient bore 22. In some embodiments, the patient bore 22 may surround an entire subject or just a portion thereof (e.g., a patient's head, thorax, and/or extremity) while an imaging session is performed.

Figure 2:
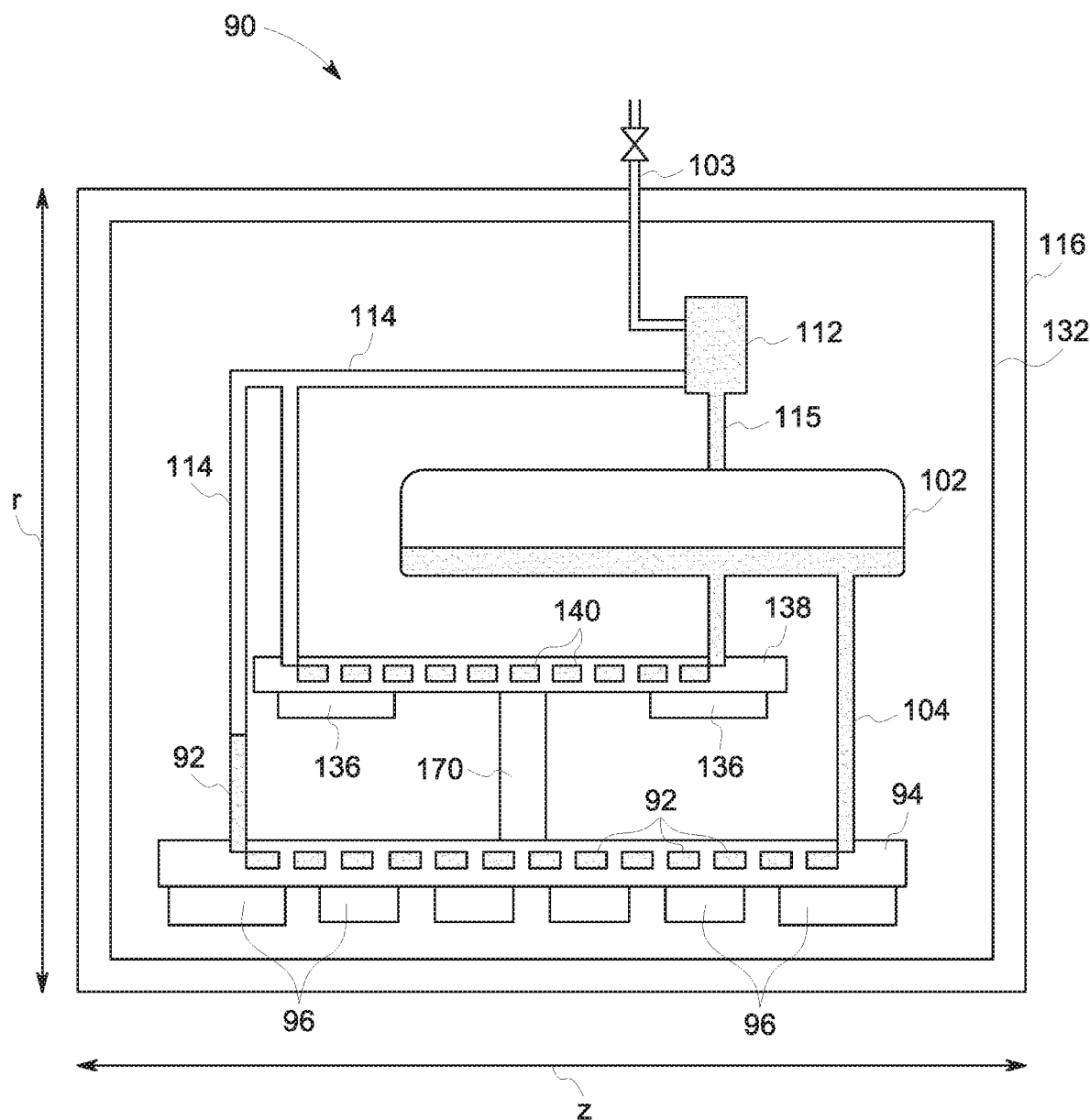
FIG. 2 is a simplified block diagram of a cooling arrangement that may be used for cooling a superconducting magnet.

With the context of FIG. 1 in mind, FIG. 2 illustrates a simplified diagram of a cooling arrangement 90 for cooling a superconducting magnet such as may be used in an MRI imaging system 10. FIG. 2 and certain of the following figures schematically depict a sectional-type view through a portion (i.e., a wall) of what is typically a cylindrical structure, i.e., the cylindrical coil and support structures, thermal shield and vacuum vessel surrounding the imaging bore of the MRI imaging system 10. In this manner, features that may be present throughout this annular arrangement are seen instead in an abstracted, cut-away manner with respect to the cylindrical structure that allows various functional relationships between features to be more readily described and discussed. With this in mind, the depicted direction r denotes a radial direction with respect to the cylindrical structure while the direction z corresponds to a direction corresponding to the imaging bore (e.g., an axis running longitudinally through the imaging bore). It should be understood, that the present views are not, and are not intended to be, to scale. In FIG. 2 and following figures, the cylinder components 96, 94, 136, 138, 132, 116 are axis-symmetric to a horizontal axis.

To simplify discussion, the cooling system 90 illustrated in FIG. 2 is provided as a closed loop circuit without pre-cooling (i.e., a single-stage cooling arrangement). Subsequent figures and examples, however, will describe implementations in which the cooling system 90 incorporates pre-cooling stage as part of a multi-stage cooling arrangement and in which aspects of the present technique are further described.

Turning to FIG. 2, the cooling arrangement, in various embodiments, includes a helium thermosiphon system that includes cooling tubes 92, or other suitable cooling paths, with liquid helium (He), or other liquid cryogen, circulating within the cooling tubes 92 cooled using a cryorefrigerator. In the depicted example, the dotted line along the bottom surface of the cylindrical coil support shell 94 denotes the circumferential section(s) of the cooling tubes running perpendicular to the plane of the figure. The cooling tubes 92 are thermally coupled to one or more coil support shells 94 that support or maintain the position of the MM magnet coils 96 forming a superconducting magnet of the MRI imaging system 10 (as discussed with respect to FIG. 1), such as main coils of the MRI imaging system 10. For example, in one embodiment the main coils may be shrink-fit and bonded inside the one or more coil support shells 94, which may be cylindrical metal coil support shells providing good thermal contact. In one embodiment, the superconducting coils may be molded coils that are wet-wound with filler epoxy, or epoxy-impregnated coils using vacuum-pressure impregnation (VPI) process.

The coil support shell 94, which may be formed from a thermally conductive material (e.g. aluminum), provides a cold mass support structure that maintains the position of or supports the magnet coils 96. The cooling tubes 92, which may be formed from any suitable metal (e.g., copper, stainless steel, aluminum, and so forth), are in fluid communication with a liquid helium storage system 102 (e.g., a storage vessel or tank), which may be formed from a plurality of liquid helium storage tanks. The liquid helium storage system 102 contains the liquid helium used in a closed loop cooling system to cool the magnet coils 96 of the MRI imaging system 10. The superconducting magnet may be cooled, for example, to a superconducting temperature, such as 4.2 Kelvin (K). In various embodiments, the liquid helium storage system 102 includes about 8-20 liters of liquid helium.

The fluid communication between the cooling tubes 92 and the liquid helium storage system 102 may be provided via one or more fluid passageways 104 (e.g., fluid tubes, conduits, and so forth). Thus, the liquid helium storage system 102 provides the liquid helium that flows through the cooling tubes 92 to cool the magnet coils 96 of the imaging system 10.

Figure 3:
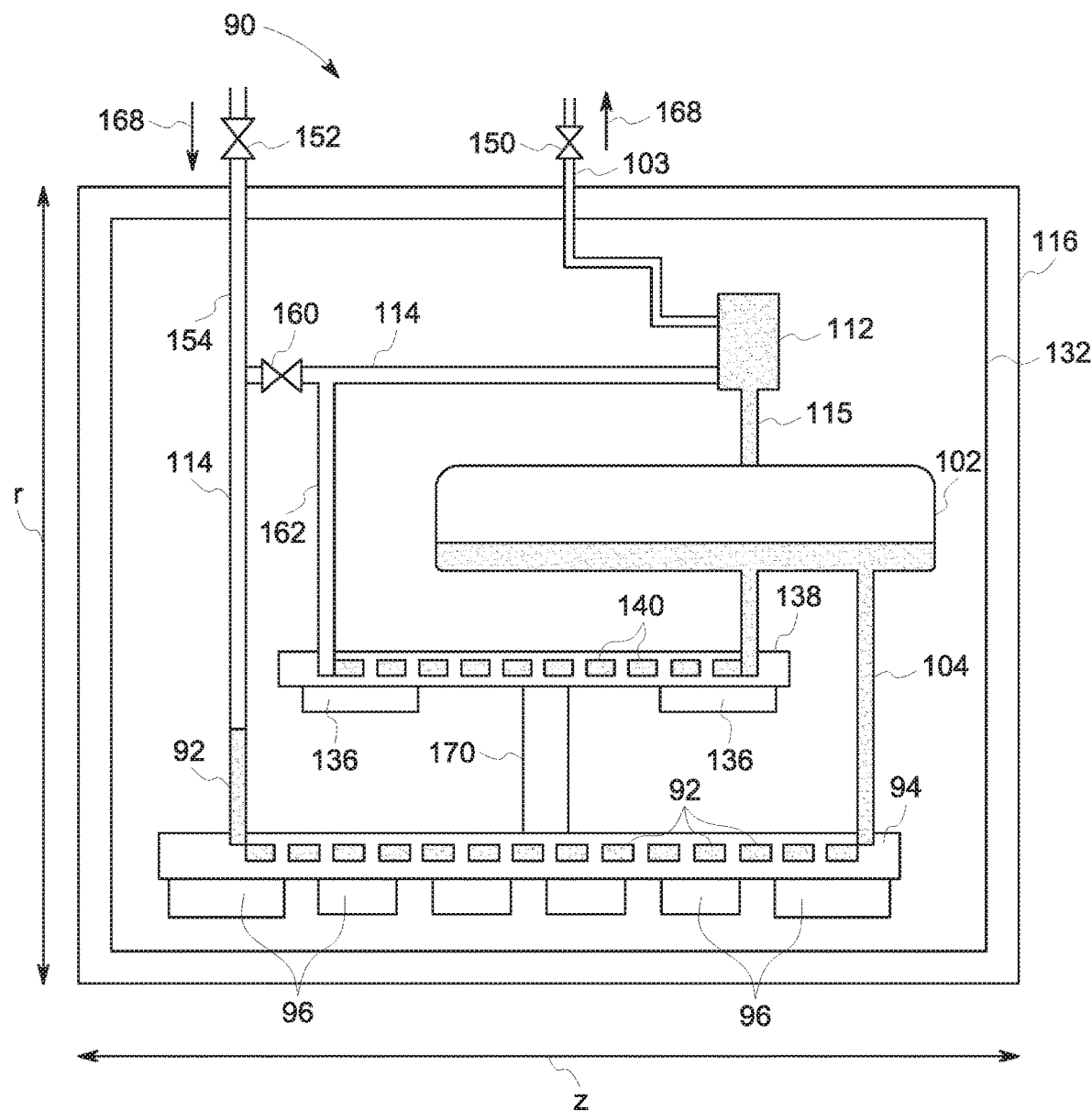
FIG. 3 is a simplified block diagram of an embodiment of a cooling arrangement that may be used to cool a superconducting magnet as seen through a section of a cylindrical magnetic coil and coil support structure, in accordance with aspects of the present disclosure.

In various embodiments, a first line 103 may be provided for addition of cryogen (such as helium or nitrogen) into the cooling arrangement. In one embodiment, as illustrated in FIG. 3, the first line 103 is provided as part of the liquid helium storage system, with helium gas being liquefied at recondensor 112 (discussed in greater detail below) as needed. The first line 103 provides a hermetically sealed configuration such that a closed-loop cooling system is provided wherein an air tight seal prevents (or significantly limits) air or gas from being introduced into the cooling circuit after the magnet device has been filled with the cryogen. For example, the air tight seal prevents oxygen, moisture, humidity, and any/or outside contaminants from entering the sealed closed-loop cooling arrangement, as well as preventing the coolant from being released from the system. However, any type of suitable sealing arrangement may alternatively be provided.

In the illustrated example of FIG. 2, the cooling arrangement includes no venting. However, in some embodiments venting may optionally be provided, for example, using a vent, such as a pressure relief valve or bust disk, having a high venting pressure level, which is substantially higher than a conventional vent, such that venting of, for example, boiled-off helium only occurs at pressure levels higher that the pressure level range for normal venting systems. For example, in some embodiments the vent may be configured to provide venting at the highest pressure that the system can handle without failure (or within a predefined range thereof). However, different pressure levels may be provided in embodiments that include the vent, which may be based on system requirements, regulatory requirements, and so forth. A pressure transducer is not shown in the depicted examples, but may be present in practice within the cooling system 90.

In one embodiment, the cooling tubes 92 are also in fluid communication with a vapor return manifold (represented here as a return line 114) which is in fluid communication with a recondenser 112 which may be provided as part of a cryorefrigerator. The recondenser condenses or recondenses helium gas (e.g., boiled off helium gas returning from the cooling tubes 92 or helium gas introduced to charge the cooling system 90). In the depicted example, helium gas received as helium vapor from the cooling tubes 92 (or first line 103) flows to the recondenser 112, where it is cooled to a liquid state. Thus, in various embodiments, the recondenser 112 receives helium gas and operates to form a free convection circulation loop to cool the magnet coils 96 and coil support structure (e.g., shell) 94 to a cryogenic temperature, as well as replenishes the liquid helium storage system 102 with liquid helium via one or more passageways 115.

A cryorefrigerator, which may be a coldhead or other suitable cryocooler, extends through a vacuum vessel 116, which contains therein the MRI magnet and cooling system 90 and the cooling components of the various embodiments. The cryorefrigerator may extend within a sleeve or housing. Thus, the cold end of the cryorefrigerator may be positioned within the sleeve without affecting the vacuum within the vacuum vessel 116. The cryorefrigerator is inserted (or received) and secured within the sleeve using any suitable means, such as one or more flanges and bolts, or other suitable means. Moreover, a motor of the cryorefrigerator may be provided outside the vacuum vessel 116. The recondensor 112 will be thermally attached to the $2^{nd}$ stage of cryocooler (not shown), and the $1^{st}$ stage of the cryocooler will be thermally attached to thermal shield 132.

Certain embodiments also provide for the use of a thermal shield 132, which may be in thermal contact with all or part of the helium storage system. In the depicted example, the MRI magnet system and the cooling components described herein are provided within the vacuum vessel 116 (e.g., a stainless steel vacuum vessel) that contains the thermal shield 132, which is made of thermally conductive material such as aluminum. The thermal shield 132 may operate as a thermally isolating radiation shield in such embodiments.

In various embodiments, the MRI imaging system 10 includes a superconducting MRI magnet formed from concentric superconducting main coils 96 (as described above) as well as bucking coils 136 supported inside cylindrical shells (the main coil support shell 94 and a bucking coil support structure (e.g., shell) 138) of high thermal conductivity. In such an arrangement, the bucking coils 136 provided on support shell 138 are operated to provide a shielding or canceling magnetic field to limit the effects or operation of the main magnetic field outside the imaging volume. In typical MRI magnet, there are 5-7 main coils and 2 bucking coils. In this example, both the main coils 96 and bucking coils 136 are cooled by the cryorefrigerator through a helium thermosiphon system as shown in FIG. 2, with the main coils 92 being directly cooled by the cooling tubes 92 and the bucking coils 136 being cooled by the bucking coil cooling tubes 140 (the dotted line along the bottom surface of the bucking coil support shell 138 denotes the circumferential section(s) of the bucking coil cooling tubes 140 running perpendicular to the plane of the figure). Thus, there is radial spacing (associated with the r dimension of FIG. 2) between the superconducting main coils 96 and bucking coils 136 in certain implementations, which are each supported on different coil support shells 94 and 138, respectively, and cooled by different respective cooling tubes. In various embodiments, the main coil support shell 94 and bucking coil support shell 138 are formed as cylindrical shells, such as formed from metal, with the cooling tubes 92 thermally coupled (e.g., bonded) to an outside surface of the coil support shell 94. For example, the support shell 94 and coil support shell 138 may have circumferentially extending solid metal walls that define a bore therein.

In one implementation, the superconducting coils 96, 136 may be molded with epoxy resin. For example, the molded coils may be wound with wet epoxy and cured to form self-supporting structures. The superconducting coils may then be bonded to the coil support shells 94 and/or 138, respectively, for example, to the outer surface of the coil support shells 94 and 138, which may be formed from aluminum. The formed superconducting coils are sized to define a bore defining an imaging volume in which a subject (e.g., a patient) may be positioned for imaging.

With the preceding in mind, and in summary of the single stage cooling shown in FIG. 2, in one embodiment of a system for cooling a superconducting magnet, a helium thermosiphon arrangement is employed that includes an evaporator system with the plurality of the cooling tubes 92 thermally attached to the magnet coil support shells 94 and/or 138, a recondenser 112 thermally attached to the cryorefrigerator, and helium storage vessels (illustrated as tanks forming the liquid helium storage system 102), all contained inside the magnet vacuum vessel 116. The main and bucking superconducting molded coils may be shrink-fit and bonded inside the cylindrical support shells 94 and 138, respectively, in some embodiments to provide for good thermal contact.

The preceding example described aspects of a single-stage cooling arrangement for simplicity and to allow aspects of such a cooling system to be introduced. In the following examples a multi-stage cooling arrangement is provided, which is illustrated as a two-stage cooling arrangement. To cool down superconducting magnet from room temperature down to about 4.2 K, it may take long time (e.g. a few weeks), if using only the cryocooler cooling power. It may therefore be useful to pre-cool the coils, coil support structure, and thermal shield down to less than 100 K by circulating high latent heat cryogen, such as liquid nitrogen, or cold cryogen gases through pre-cooling tubes. This pre-cooling is the first-stage of cooling. The second-stage of cooling is conducted by thermosiphon cooling. The second stage of the cryocooler is thermally attached with recondensor 112, which is part of the thermos-siphon based cooling described with respect to FIG. 2, which may provide cooling during steady state operation and or during power out conditions, allowing for a "ride-through" mode to provide an operation temperature of about 4.2 K. Thus, the cooling arrangement for cooling the magnet coils 96 in various embodiments operates in a refrigerator type manner and also allows for boiling of helium during power off conditions (e.g., 5-10 hours of power off), which also allows for the MRI system to be turned off before magnet quench.

As noted herein, such a multi-stage cooling arrangement may introduce complexity in terms of additional tubing, conduits, welds, and so forth. The present techniques simplify such a multi-stage arrangement by allowing tubing and conduits to be shared between cooling stages. In particular, various embodiments of the present technique provide systems and methods for cooling superconducting magnets (such as during power off, energization, or steady state operation) using an integrated cooling circuit to provide both forced-flow pre-cooling functionality and closed-loop thermosiphon cooling for persistent mode operation of a superconducting magnet. In one embodiment, the integrated cooling circuit shares a single set of cooling tubes (which may be the majority of the flow path) for use with both a forced flow cooling circuit as well as a closed-loop cooling circuit. A mode selector valve 160 is included in the return path of the closed-loop circuit. The state of this valve (i.e., open or closed) determines whether the flow path corresponds to the forced cooling mode or the closed loop cooling mode. In one embodiment, one or more external valves are located at the inlet and at the outlet of the forced flow cooling tubes, respectively. In accordance with this technique, the cooling circuit is simplified and magnet cost may be reduced due to the integration of the flow path of both circuits. While the present technique is described generally in the context of a MRI imaging system in order to provide a useful real-world context, it may also be appreciated, however, that the present technique may also be used to more generally provide cooling of superconducting magnet devices in both medical and non-medical contexts, such as cooling the superconducting magnets for electrical machines and/or magnetic storage systems.

Turning to FIG. 3, various embodiments include an integrated cooling system (which may operate or function as a two-stage system) for cooling superconducting magnet devices, which include superconducting coils. In a first example, depicted in FIG. 3, an integrated cooling circuit combining flow paths of a pre-cooling stage and a persistent operation stage is depicted. Valves are positioned in the flow path which, based on their flow state, determine whether the cooling system 90 is functioning in a pre-cooling or persistent operation mode.

In the depicted example, a first valve 150 is provided on the first line 103 such that, in an open state cryogen (e.g., helium) may flow through the first line 103 while in a closed state cryogen cannot flow through the first line 103. A second valve 152 is also provided to regulate the flow of cryogen (either gaseous or liquid) into a second line 154 that is part of the pre-cooling circuit. When the second valve 152 is in an open state, cryogen may flow through the second line 154, while in a closed state no cryogen flows in or out of the second line 154. Further, a mode selector valve 160 is positioned between, on one side, the second line 154/return line 114 and, on the other side, the recondensor 112 and a bucking return line 162. When the mode selector valve 160 is in an open state, cryogen may flow between the return line 114 and the recondensor 112.

With the preceding valve and line arrangement in mind, in a forced flow pre-cooling mode (e.g., a first state or mode) the mode selector valve 160 is closed, so as to prevent the flow of cryogen between the second line 154 and the recondensor 112 and/or the bucking coil support shell 138. In this pre-cooling mode, the first valve 150 and the second valve 152 are both opened. In this valve configuration and in one implementation, cryogen (e.g., liquid nitrogen, or liquid helium or gaseous helium) is flowed through the second line 154 through the main cold mass (i.e., the primary coil support shell 94) to the liquid helium storage system (e.g., tank) 102, through the thermal shield 132 and then out via first valve 150, as indicated by directional flow arrows 168. As may be appreciated, however, in alternative implementations this pre-cooling flow may be reversed, so that the forced flow of cryogen is instead through the first line 103 and out the second line 154, with the closed mode selector valve 160 preventing direct flow from the recondensor 112 and the second line 154.

As noted above, due to the placement of mode selector valve 160, the bucking coil support shell (and corresponding bucking coils 136) is excluded from direct cooling in these implementations of a force flow circuit. Instead, the bucking cold mass is cooled via thermal conduction through the gusset 170 connected to the main cold mass (i.e., the primary coil support shell 94).

Conversely, in a closed-loop or operational cooling mode (e.g., a second state or mode) the mode selector valve 160 is open, so as to allow the flow of cryogen between the return line 114 and the recondensor 112. In this operational cooling mode, the first valve 150 and the second valve 152 are both closed, so that no cryogen flows outside the closed loop defined within the thermal shield 132. In this valve configuration, cryogen (e.g., liquid helium) is flowed in a closed loop through the cooling tubes 92 proximate the main cold mass (i.e., the primary coil support shell 94), up the return line 114, through the open mode selector valve 160 to the recondensor 112 (where any evaporated helium is recondensed), and back to the liquid helium storage system (e.g., tank) 102 for continued circulation. Similarly, and in parallel, cryogen is flowed through the cooling tubes proximate the bucking coil support shell 138, up the bucking return line 162, and to the recondensor 112 (where any evaporated helium is recondensed), and back to the liquid helium storage system (e.g., tank) 102 for continued circulation.

Figure 4:
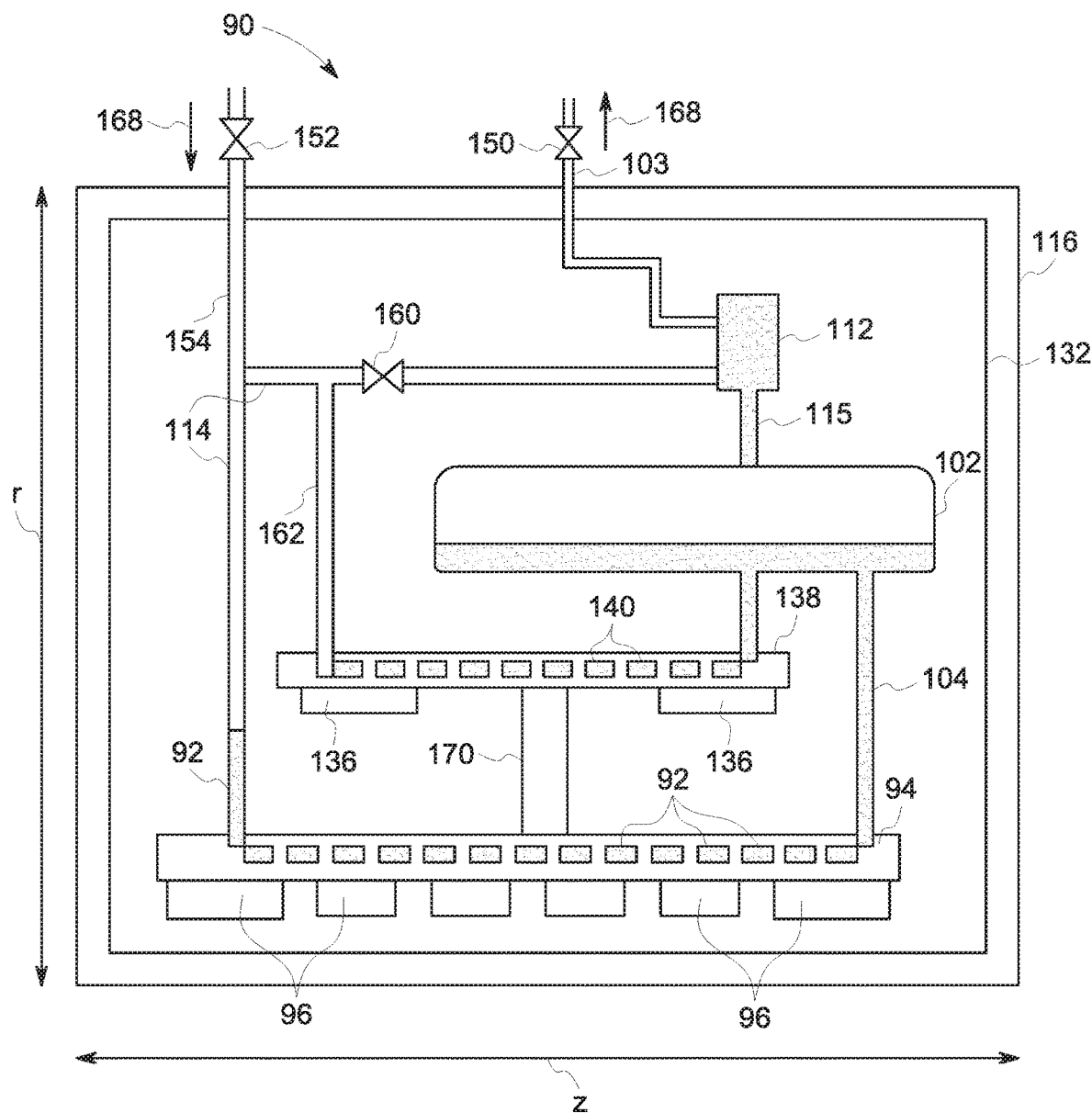
FIG. 4 is a simplified block diagram of a further embodiment of a cooling arrangement that may be used to cool a superconducting magnet as seen through a section of a cylindrical magnetic coil and coil support structure, in accordance with aspects of the present disclosure.

Turning to FIG. 4, in a further embodiment the position of the mode selector valve 160 is changed relative to the preceding embodiment. In particular, the mode selector valve 160 is positioned between the bucking return line 162 and the recondensor 112. As in the preceding example, the open/close state of the mode selector valve 160 determines the whether the integrated cooling system operates in a pre-cooling mode or an operational mode.

With the preceding valve and line arrangement in mind, in a forced flow pre-cooling mode (e.g., a first state or mode) the mode selector valve 160 is closed, so as to prevent the direct flow of cryogen between the second line 154 and the first line 103. The first valve 150 and the second 152 are both opened. In this valve configuration and in one implementation, cryogen (e.g., liquid nitrogen, or liquid helium or gaseous helium) is flowed through the second line 154 through the main cold mass (i.e., the primary coil support shell 94) to the liquid helium storage system (e.g., tank) 102, through the thermal shield 132 and then out via first valve 150, as indicated by directional flow arrows 168. In addition, due to the position of the mode selector valve 160 in this embodiment, when the mode selector valve 160 is closed the cryogen also flows through the second line 154 and through the bucking coil support shell 138 to the liquid helium storage system (e.g., tank) 102, through the thermal shield 132 and then out via first valve 150. Thus, in this configuration both the primary coil support shell 94 and the bucking coil support shell 138 are directly cooled (in parallel) by the forced flow of cryogen from the forced second line 154 to the first line 103. As in the preceding example, in alternative implementations this pre-cooling flow may be reversed, so that the forced flow of cryogen is instead through the first line 103 and out the second line 154, with the closed mode selector valve 160 preventing direct flow from the recondensor 112 and the second line 154.

In the closed-loop or operational cooling mode (e.g., a second state or mode) the mode selector valve 160 is open, so as to allow the flow of cryogen between, on one side, the return line 114 and bucking return line 162 and, on the other side, the recondensor 112. The first valve 150 and the second 152 are both closed, so that no cryogen flows outside the closed loop defined within the thermal shield 132. In this valve configuration, cryogen (e.g., liquid helium) is flowed in a closed loop through the cooling tubes 92 proximate the main cold mass (i.e., the primary coil support shell 94), up the return line 114, through the open mode selector valve 160 to the recondensor 112 (where any evaporated helium is recondensed), and back to the liquid helium storage system (e.g., tank) 102 for continued circulation. Similarly, and in parallel, cryogen is flowed in through the cooling tubes proximate the bucking coil support shell 138, up the bucking return line 162, through the open mode selector valve 160 to the recondensor 112, and back to the liquid helium storage system (e.g., tank) 102 for continued circulation.

While the preceding two examples depict implementations in which the mode selector valve 160 is positioned in a line leading to the recondensor 112, other implementations are also contemplated. By way of example, and turning to FIGS. 5 and 6, in other implementations the mode selector valve 160 may be positioned along a bypass line 180 running between the second line 154 to the first line 103. This effectively separates the second line 154 and return line 114 which, in the preceding example, met at the line returning to the recondensor 112.

Figure 5:
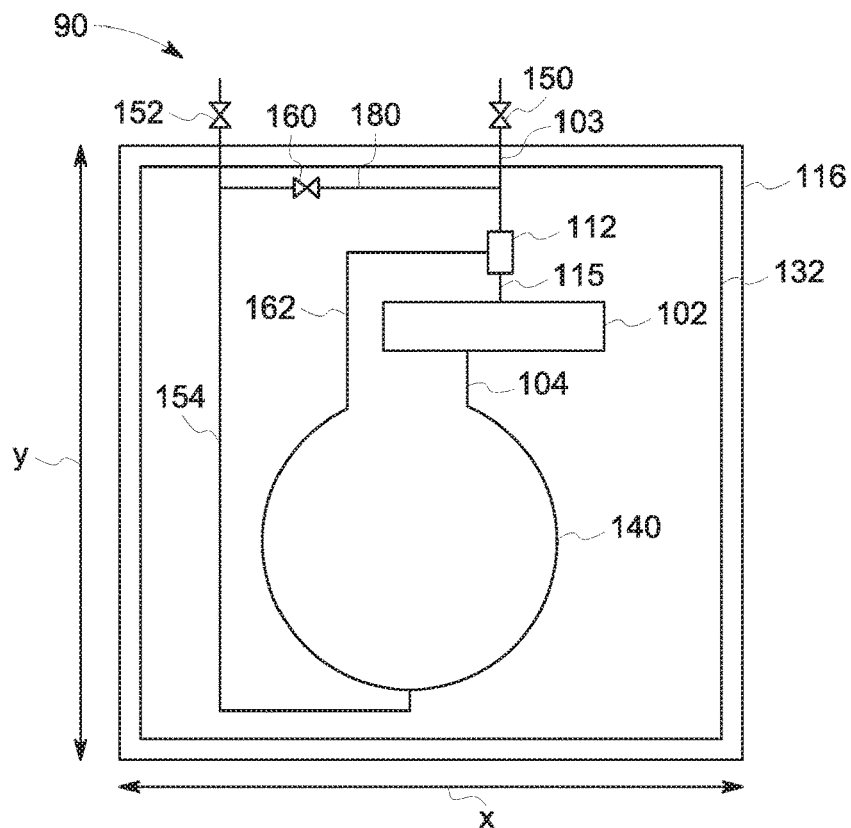
FIG. 5 is a simplified block diagram of an additional embodiment of a cooling arrangement that may be used to cool a superconducting magnet as seen from an end-view perspective, in accordance with aspects of the present disclosure.
Figure 6:
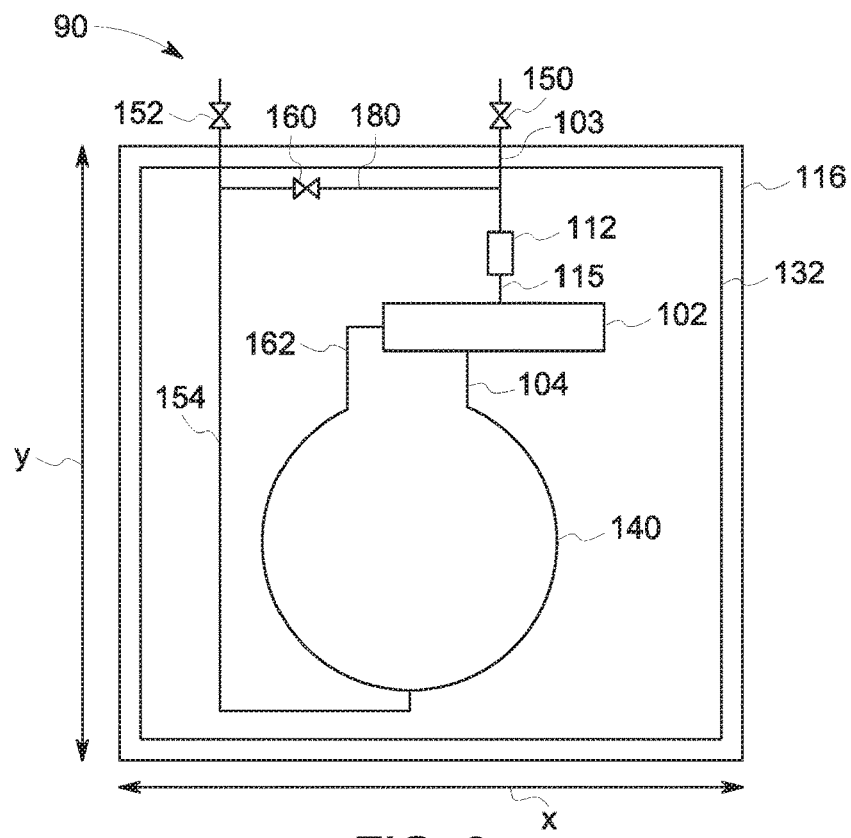
FIG. 6 is a simplified block diagram of another embodiment of a cooling arrangement that may be used to cool a superconducting magnet as seen from an end-view perspective, in accordance with aspects of the present disclosure.

It may be noted that FIGS. 5 and 6 are shown from a different view perspective than the preceding figures, notably down the cylindrical imaging bore of an MRI imaging system 10, and, due to this change in perspective, do not depict the same sectional view through a portion (i.e., a wall) of the cylindrical structure(s) associated with the magnet coils and shielding (i.e., the cylindrical coil and support structures surrounding the imaging bore of the MRI imaging system 10). Instead, FIGS. 5 and 6 depict a schematic-type representation down the bore in which the cylindrical cooling loop corresponding to these cylindrical structures may be more readily appreciated. To simplify discussion of the cooling arrangement of interest, other structural features shown in FIGS. 3 and 4 are omitted from the views of FIGS. 5 and 6. However, it should be appreciated that this is done merely to simplify the representation and allow aspects of the cooling system to be more readily discerned. It should be understood that other structural and functional features related to the magnet and coils discussed in FIGS. 3 and 4 are also present in the embodiments of FIGS. 5 and 6, even if not shown.

Turning to FIG. 5, with this valve and line arrangement in mind, in a forced flow pre-cooling mode (e.g., a first state or mode) the mode selector valve 160 is closed, which prevent the direct flow of cryogen between second line 154 and the first line 103. The second line 154 connects to the cooling system tubes at a location generally opposite the recondensor 112 and storage system (i.e., storage tank) 102, here shown as at the bottom of the imaging system. In one embodiment, the second line 154 connects to the bucking coil cooling tubes 140 at the bottom of the imaging system (or opposite the storage tank 102). The bucking coil cooling tubes 140 are circumferentially outside the main coil cooling tubes 92 and, in addition to cooling the bucking coils 136, act to cool the main magnet coils 96 and associated cold mass via thermal conduction through the gusset 170 (as shown via the structure view in FIGS. 3 and 4).

Thus, in pre-cooling operation, the first valve 150 and the second valve 152 are both opened while the mode selector valve 160 is closed. In this valve configuration and in one implementation, cryogen (e.g., liquid helium or gaseous helium) is flowed through the second line 154 to the bucking coil cooling tubes 140, up to the recondensor 112 and out through the first line 103. Thus, in this configuration the bucking coil support shell 138 is directly cooled by the forced flow of cryogen from the second line 154 to the first line 103 and the interior coil support shell 94 is indirectly cooled via thermal conduction as the bucking coil support shell 138 is cooled. As in the preceding example, in alternative implementations this pre-cooling flow may be reversed, so that the forced flow of cryogen is instead through the first line 103 and out the second line 154, with the closed mode selector valve 160 preventing direct flow from the first line 103 to the second line 154.

Conversely, in the closed-loop or operational cooling mode (e.g., a second state or mode) the mode selector valve 160 is open and the first valve 150 and second valve 152 are both closed. This valve configuration equilibrates the pressure between bucking return line 162 and the second line 154 and the second line 154 fills with cryogen (e.g., liquid helium). Once equilibrated, cryogen may flow though the closed loop formed by the standard cooling tubes (e.g., cooling tubes 92 and bucking coil cooling tubes 140), recondensor 112, and storage system 102 to achieve operational cooling of the various coils. In one such implementation cooling of components may be achieved to 4 K. Because the heat load to the second line 154 is negligible, boil-off of cryogen to room temperature is minimal or otherwise limited.

Turning to FIG. 6, in an alternative implementation a similar cooling arrangement to the one depicted in FIG. 5 is provided, however the return path of the bucking return line 162 and/or return line 114 goes to the storage tank 102 (e.g., the top of the storage tank 102). Operation of the pre-cooling and operational modes in this cooling arrangement, however, is similar to that described with respect to FIG. 5. Such an alternative cooling path configuration may be applied to the embodiments discussed with respect to FIGS. 3 and 4 as well.

Technical effects of the invention include using an integrated cooling circuit to provide both forced-flow pre-cooling functionality and closed-loop thermosiphon cooling for persistent mode operation of a superconducting magnet. In one embodiment, the integrated cooling circuit shares a single set of cooling tubes (which may be the majority of the flow path) for use with both a forced-flow pre-cooling circuit as well as a closed-loop operating-state cooling circuit. A valve may, in one embodiment, be included in the return path of the closed-loop circuit and the state of this valve (i.e., open or closed) determines whether the flow path corresponds to the forced cooling mode or the closed loop cooling mode. One or more external valves may also be provided at the inlet and outlet of the forced flow cooling tubes respectively. In accordance with this technique, the cooling circuit is simplified and magnet cost may be reduced.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:
1. A cryogenic cooling system, comprising:
   a superconducting magnet comprising a set of magnet coils disposed on a cylindrical coil support structure; and
   a cooling system configured to cool at least the set of magnet coils, the cooling system has an operational mode and a pre-cooling mode, wherein the cooling system comprises:
     a recondensor configured to recondense cryogen from vapor to liquid;
     a first line configured to allow cryogen to be added to the cooling system and connecting to the recondensor, wherein a first end of the first line is outside of a vacuum vessel;
     a storage vessel in fluid communication with the recondensor and configured to hold cryogen;

a plurality of cooling tubes in fluid communication with the storage vessel and configured to cool the set of magnet coils;
a return line configured to convey cryogen from the plurality of cooling tubes to the recondensor;
a second line in fluid communication with the return line, wherein a first end of the second line is outside of the vacuum vessel;
a mode selector valve provided on the return line;
a first valve provided on the first line; and
a second valve provided on the second line;
wherein in the pre-cooling mode the mode selector valve is closed, the first valve is open, and the second valve is open so that cryogen flows in through one of the first line or the second line, through the cooling tubes, the storage vessel, and the recondensor, and out through the other of the first line or the second line; and
wherein the cryogenic cooling system further comprises:
a bucking coil superconducting magnet comprising a set of bucking coils on a cylindrical bucking coil support structure, wherein the bucking coil support structure is radially offset from the cylindrical coil support structure;
a plurality of bucking coil cooling tubes in fluid communication with the storage vessel and configured to cool the set of bucking coils during operation; and
a bucking return line in fluid communication with the return line and configured to convey one or both of liquid cryogen or cryogen vapor to the recondensor;
wherein the mode selector valve is positioned on the return line between where the second line connects to the return line and where the bucking return line connects to the return line; and
wherein, when the cryogenic cooling system is in the pre-cooling mode, cryogen does not flow through the bucking return line or plurality of bucking coil cooling tubes.

2. The cryogenic cooling system of claim 1, wherein in the operational mode the mode selector valve is open, the first valve is closed, and the second valve is closed so that cryogen flows from the storage vessel to the cooling tubes, from the cooling tubes through the return line to the recondensor, and from the recondensor back to the storage vessel.

3. The cryogenic cooling system of claim 1, wherein the superconducting magnet and the cooling system are part of a magnetic resonance imaging (MRI) system.

4. The cryogenic cooling system of claim 1, wherein the cryogen comprises helium.

5. The cryogenic cooling system of claim 1, wherein, when the cryogenic cooling system is in the pre-cooling mode, the bucking coils are cooled by a thermally conductive structure connecting the coil support structure and bucking coil support structure.

6. The cryogenic cooling system of claim 1, wherein the mode selector valve is positioned on the return line between the recondensor and where the bucking return line connects to the return line;
wherein, when the cryogenic cooling system is in the pre-cooling mode, cryogen flows through the bucking return line and bucking coil cooling tubes to the storage vessel.

7. A cryogenic cooling system, comprising:
a superconducting magnet comprising a set of magnet coils disposed on a cylindrical coil support structure;
a bucking coil superconducting magnet comprising a set of bucking coils on a cylindrical bucking coil support structure, wherein the bucking coil support structure is radially offset from and external to the cylindrical coil support structure; and
a cooling system configured to cool at least the set of magnet coils, the cooling system has an operational mode and a pre-cooling mode, wherein the cooling system comprises:
a recondensor configured to recondense cryogen from vapor to liquid;
a first line configured to allow cryogen to be added to the cooling system and connecting to the recondensor, wherein a first end of the first line is outside of a vacuum vessel;
a storage vessel in fluid communication with the recondensor and configured to hold cryogen;
a plurality of bucking coil cooling tubes in fluid communication with the storage vessel and configured to cool the set of bucking coils;
a bucking return line configured to convey cryogen from the plurality of bucking coil tubes to one of the recondensor or the storage vessel;
a second line in fluid communication with the bucking coil cooling tubes, wherein a first end of the second line is outside of the vacuum vessel;
a bypass line fluidly connecting the second line and the first line;
a mode selector valve provided on the bypass line;
a first valve provided on the first line; and
a second valve provided on the second line;
wherein in the pre-cooling mode the mode selector valve is closed, the first valve is open, and the second valve is open so that cryogen flows in through one of the first line or the second line, through the bucking coil cooling tubes, the bucking return line, and one of the storage vessel or recondensor, and out through the other of the first line or the second line; and
wherein the cryogenic cooling system further comprises:
a plurality of cooling tubes in fluid communication with the storage vessel and configured to cool the set of magnet coils during operation;
a return line in fluid communication configured to convey cryogen from the plurality of cooling tubes to the recondensor; and
wherein, when the cryogenic cooling system is in the pre-cooling mode, cryogen does not flow through the return line or plurality of cooling tubes.

8. The cryogenic cooling system of claim 7, wherein in the operational mode the mode selector valve is open, the first valve is closed, and the second valve is closed so that cryogen flows from the storage vessel to the bucking coil cooling tubes, and from the bucking coil cooling tubes through the return line to the recondensor or the storage vessel.

9. The cryogenic cooling system of claim 7, wherein the superconducting magnet and the cooling system are part of a magnetic resonance imaging (MRI) system.

10. The cryogenic cooling system of claim 7, wherein, when the cryogenic cooling system is in the pre-cooling mode, the magnet coils are cooled by a thermally conductive structure connecting the coil support structure and bucking coil support structure.

11. A method for cooling a superconducting magnet, comprising:
in a pre-cooling phase, closing a mode selector valve that directly or indirectly controls flow of cryogen from a first line to a second line;

opening a second valve and a first valve that control flow of cryogen through the second line and the first line respectively;

flowing cryogen from the one of the first line or the second line to the other of first line or the second line through one or both of a plurality of cooling tubes for cooling a set of magnet coils or a plurality of bucking coil cooling tubes for cooling a set of bucking coils; and in an operational cooling phase, opening the mode selector valve and closing the second valve and the first valve;

flowing cryogen from a storage vessel through the plurality of cooling tubes and a return line to a recondensor; and flowing cryogen from the storage vessel through the plurality of bucking coil cooling tubes and a bucking return line to the recondensor; and wherein the mode selector valve is positioned on the return line between where the second line connects to the return line and where the bucking return line connects to the return line, and wherein, when the cryogenic cooling system is in the pre-cooling phase, cryogen does not flow through the bucking return line or plurality of bucking coil cooling tubes.

12. The method of claim 11, wherein the mode selector valve is positioned on the return line between the recondensor and where the bucking return line connects to the return line, and wherein, when the cryogenic cooling system is in the pre-cooling phase, cryogen flows through the bucking return line and bucking coil cooling tubes to the storage vessel.

13. The method of claim 11, wherein the mode selector valve is positioned on a bypass line fluidly connecting the second line and the first line.

14. The method of claim 13, wherein, when the cryogenic cooling system is in the pre-cooling phase, cryogen flows in through one of the first line or the second line, through the bucking coil cooling tubes, the bucking return line, and the recondensor and out through the other of the first line or the second line.

15. The method of claim 13, wherein, when the cryogenic cooling system is in the pre-cooling phase, cryogen flows in through one of the first line or the second line, through the bucking coil cooling tubes, the bucking return line, and the storage vessel, and out through the other of the first line or the second line.

* * * * *